United States Patent
Chen et al.

(10) Patent No.: US 9,674,980 B2
(45) Date of Patent: Jun. 6, 2017

(54) MOUNTING EAR WITH CURTAIN

(71) Applicant: Quanta Computer Inc., Taoyuan (TW)

(72) Inventors: Chao-Jung Chen, Taoyuan (TW); Chih-Ming Chen, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 0 days.

(21) Appl. No.: 15/044,782

(22) Filed: Feb. 16, 2016

(65) Prior Publication Data
US 2017/0034943 A1    Feb. 2, 2017

Related U.S. Application Data

(60) Provisional application No. 62/198,715, filed on Jul. 30, 2015.

(51) Int. Cl.
*H02B 1/01* (2006.01)
*H05K 7/14* (2006.01)
*F16L 3/06* (2006.01)

(52) U.S. Cl.
CPC ............. *H05K 7/1489* (2013.01); *F16L 3/06* (2013.01)

(58) Field of Classification Search
CPC .................................. H05K 7/1489; F16L 3/06
USPC .......................... 361/807, 809, 810, 825, 826
See application file for complete search history.

(56) References Cited

U.S. PATENT DOCUMENTS

| | | | | |
|---|---|---|---|---|
| 5,735,411 A | * | 4/1998 | Flamme | H02B 1/30 108/180 |
| 7,920,387 B2 | * | 4/2011 | Barrett | H05K 7/1418 361/741 |
| 7,975,860 B2 | * | 7/2011 | Dittus | H05K 7/1489 211/192 |
| 8,931,742 B2 | * | 1/2015 | Gong | H02G 3/02 248/49 |
| 2003/0160010 A1 | * | 8/2003 | Robertson | H05K 7/1411 211/26 |
| 2007/0242420 A1 | * | 10/2007 | Hoshino | G02B 6/4453 361/600 |
| 2012/0104200 A1 | * | 5/2012 | Grady, IV | H05K 7/1489 248/222.14 |

* cited by examiner

*Primary Examiner* — Hung S Bui
(74) *Attorney, Agent, or Firm* — Nixon Peabody, LLP; Eduardo J. Quinones (57) ABSTRACT

A mounting ear is provided. The mounting ear includes a front plate and a side plate connected to the front plate. The side plate includes a tail section proximate to the rear of the side plate, a midsection between the front plate and the tail section, and at least a portion of the tail section has a height larger than the midsection to thereby define a gap above the midsection. A brush is mounted on at least the midsection. The brush includes plurality of bristles extending from the brush such that the end of the bristles are substantially collinear with a top of the at least of portion of the tail section, to thereby substantially cover the gap.

14 Claims, 7 Drawing Sheets

MOUNTING EAR WITH CURTAIN

CROSS-REFERENCE TO RELATED APPLICATIONS

This application claims priority to U.S. Provisional Application No. 62/198,715 entitled "Mounting device for server switch or other unit power cord can rout its power cord to rack front side", filed on Jul. 30, 2015, the contents of which are expressly incorporated by reference in its entirety.

FIELD OF THE INVENTION

The various embodiments described herein relate generally to a mounting ear. More specifically, various embodiments described herein generally relate to a mounting ear with a curtain to allow objects to pass while blocking airflow.

BACKGROUND

Figure 1:
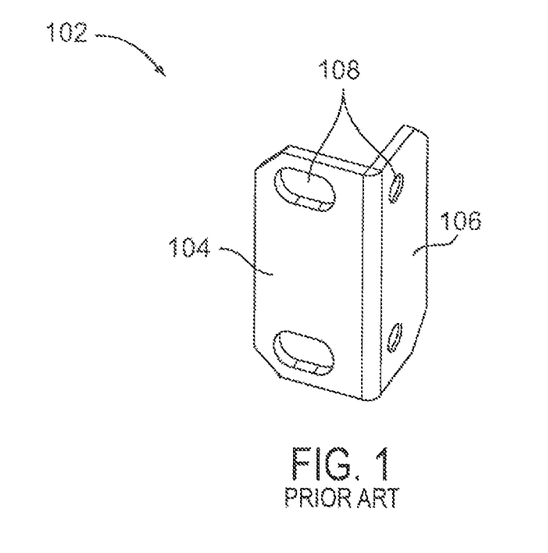
FIG. 1 illustrates a prior art mounting ear.
Figure 2:
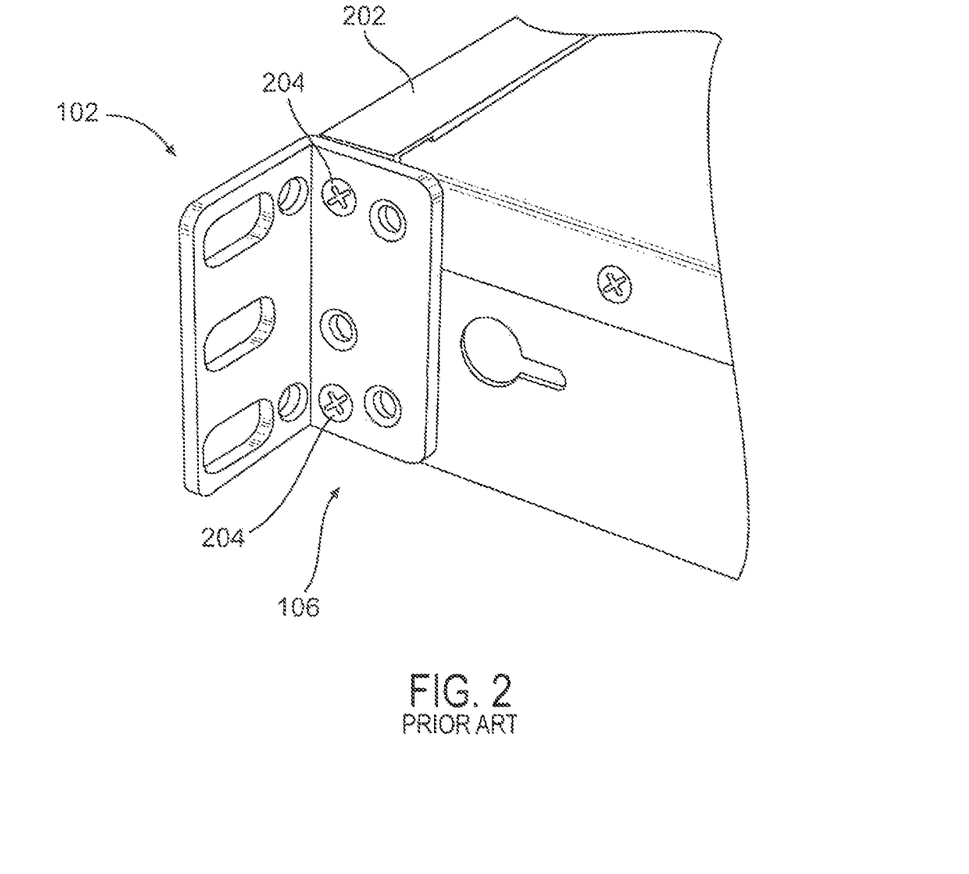
FIG. 2 illustrates a prior art mounting ear on a component.
Figure 3:
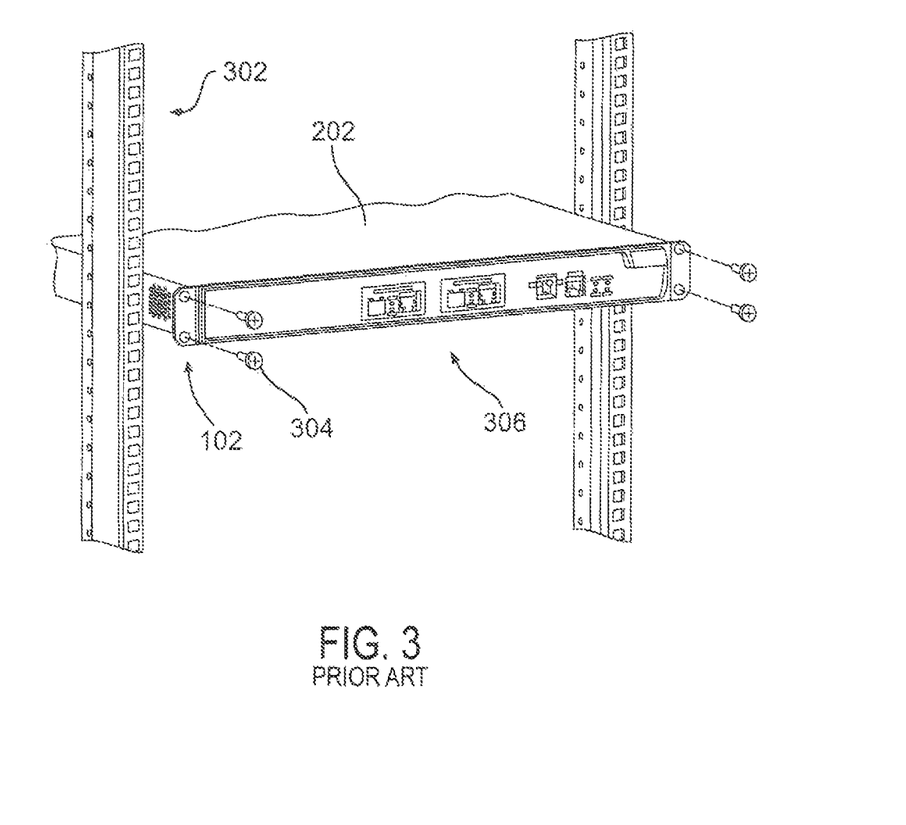
FIG. 3 illustrates a prior art mounting ear mounting a component onto a rack.

A mounting ear is a type of bracket that connects a component to a support structure, such as a server component on a server rack. A typical mounting ear 102 is shown in FIG. 1. The mounting ear 102 has a front plate 104 and a side plate 106, both with holes 108 for receiving screws. As seen in FIG. 2, side plate 106 can be attached to a component 202 by screws 204. As seen in FIG. 3, the component 202 with mounting ear 102 is mounted on rails 302 of a rack by screws 304 through the front plate 104; similar connections may be present on the rear side (not shown) to provide support at the four corners of component 202.

As seen in FIG. 3, component 202 may have a variety of jacks 306 for data and power connections. Often these jacks are easily accessible without any need to access the interior of the rack, such as the configuration shown in FIG. 3. However, it may be necessary to run data or power cords further back into the rack to reach jacks that are not as easily accessible as jacks 306 in FIG. 3. Space must therefore be reserved on the sides, top or bottom of component 202 to allow such cords to pass. Since the cords will not occupy the full length/width/height of the reserved space, there will be a spacing gap by which air and contaminants can reach the interior of the rack. Additionally, if space is reserved above or below the components 202, the number of other components that can be attached to rails 302 may be significantly reduced.

SUMMARY OF THE INVENTION

According to an embodiment of the invention, a mounting ear is provided. The mounting ear includes a front plate and a side plate connected to the front plate. The side plate includes a tail section proximate to the rear of the side plate, a midsection between the front plate and the tail section, and a side of the tail section and top of the midsection define a gap above the midsection. A brush is mounted on at least the midsection. The brush includes plurality of bristles extending from the brush such that the end of the bristles are substantially collinear with a top of the at least of portion of the tail section, to thereby substantially cover the gap. The front plate is configured to attach to a vertical rail of a rack, the side plate is configured to attach to a horizontal component to support the component perpendicular to the rail in the rack, the gap is configured to accommodate a cord for the component or other accessories in the rack, and the bristles form a curtain across the gap to limit the flow of air and contaminants through the gap while providing a pathway for the cord to pass through the gap.

The above embodiment may have various features. The brush may be made of a strip of rubber, and the bristles are cut flaps of the strip of rubber. The brush may be glued to the midsection. The brush may extend substantially across all of the midsection. The front plate may have substantially the same height as the midsection. The tail section may have a height substantially equal to the height of the component. An end of the side panel rear of the tail section may have a smaller height than the tail section.

According to an embodiment of the invention, a rack system is provided. A rack chamber has vertical rails. A component is mounted horizontally in the rack chamber. A cord is connected to a jack inside the rack chamber. A mourning ear connects the component to one of the rails. The mounting ear includes a front plate and a side plate connected to the front plate. The side plate includes a tail section proximate to the rear of the side plate, a midsection between the front plate and the tail section, and a side of the tail section and top of the midsection define a gap above the midsection. A brush is mounted on at least the midsection. The brush includes plurality of bristles extending from the brush such that the end of the bristles are substantially collinear with a top of the at least of portion of the tail section, to thereby substantially cover the gap. The front plate is attached to one of vertical rails, the side plate is attached to the component, the cord parts the bristles and passes through the gap, and the bristles form a curtain across the gap to limit the flow of air and contaminants into the rack chamber.

The above embodiment may have various features. The brush may be made of a strip of rubber, and the bristles are cut flaps of the strip of rubber. The brush may be glued to the midsection. The brush may extend substantially across all of the midsection. The front plate may have substantially the same height as the midsection. The tail section may have a height substantially equal to the height of the component. An end of the side panel rear of the tail section may have a smaller height than the tail section.

Details of one or more implementations are set forth in the accompanying drawings and the description below. Other features, aspects, and potential advantages will be apparent from the description and drawings, and from the claims.

BRIEF DESCRIPTION OF THE DRAWINGS

Various embodiments in accordance with the present disclosure will be described with reference to the drawings, in which.

DETAILED DESCRIPTION

In the following description, various embodiments will be illustrated by way of example and not by way of limitation in the Figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Several definitions that apply throughout this disclosure will now be presented. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like. The term "a" means "one or more" unless the context clearly indicates a single element.

Figure 4A:
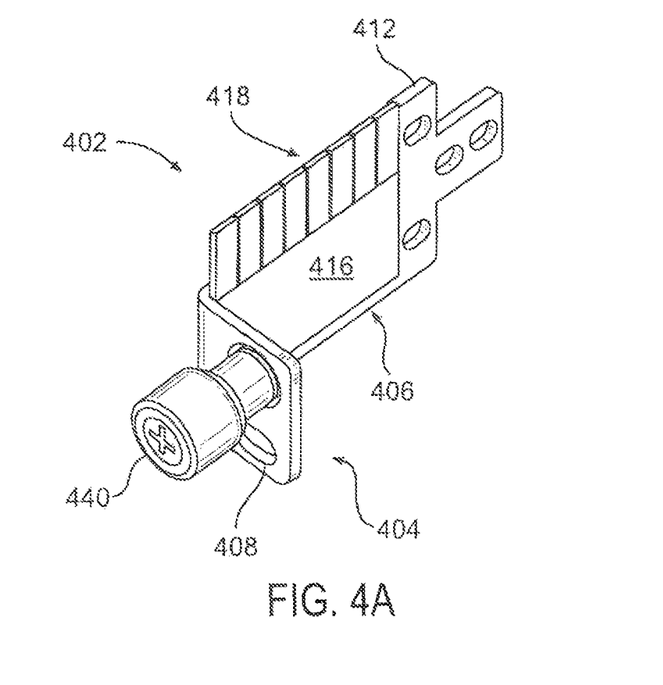
FIGS. 4A and 4B are front and rear perspective views of an embodiment of a mounting ear according to an embodiment of the invention.
Figure 4B:
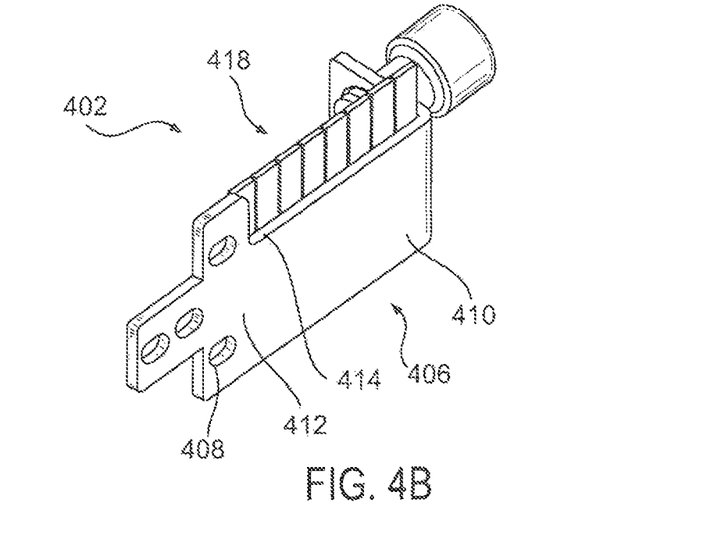

Referring now to FIGS. 4A and 4B, a mounting ear 402 according to an embodiment of the invention is shown. The mounting ear 402 has a front plate 404 and a side plate 406, both with holes 408. Holes 408 are for receiving screws or the like, such by way of non-limiting example thumb screw 440. Screws or the like connect mouthing ear 402 to a component and a rail in a manner well known in the art (such as by way of non-limiting example shown in FIGS. 2 and 3) and not further discussed in detail herein.

Side plate 406 includes a midsection 410 and a tail section 412. At least a portion of tail section 412 has a greater height than midsection 410 to define a gap 414. Preferably the noted portion of tail section 412 has a height substantially the same height as a component 202 that it would attach to; with substantially matched heights, the tail section 412 and the component 202 would form an L shaped connection that blocks air and contaminants from entering past the component 202 into the rack chamber, but again the invention is not so limited. The embodiment of FIGS. 4A and 4B show the height of tail section 412 narrowing as it extends rearward, but the invention is not so limited and it may have the same height throughout.

A brush 416 having bristles 418 is mounted on the interior of midsection 410. Brush 416 preferably extends lengthwise from front plate 404 through tail section 412, and may partially overlap into front plate 404 and/or tail section 412. Bristles 418 extend from brush 416 and terminate substantially at the top of the tail section 412, such that the tops of bristles 416 and tail section 412 are substantially collinear. Bristles 418 form a flexible curtain across gap 414. Preferably the bristles 418 have sufficient flexibility to part to allow components through gap 414, but are sufficiently rigid to maintain their shape if the mounting ear is installed with the bristles 418 extending upwards, although the invention is not so limited.

Brush 416 is preferably a strip of rubber, and bristles 418 are preferably formed by vertically cutting the top portion of the strip into individual flap segments. By way of another non-limiting example, brush 416 could be akin to a paintbrush, for which bristles 418 are thin filaments embedded into some type of support. However, the invention is not so limited, and other forms of brushes may be used.

Brush 416 is preferably attached to the mounting ear 402 by glue or epoxy. However, the invention is not so limited, and other forms of attachment (e.g., screws, welding, melting) may also be used. The invention is not limited to the particulars of how the brush 416 is connected to mounting ear 402.

Figure 5A:
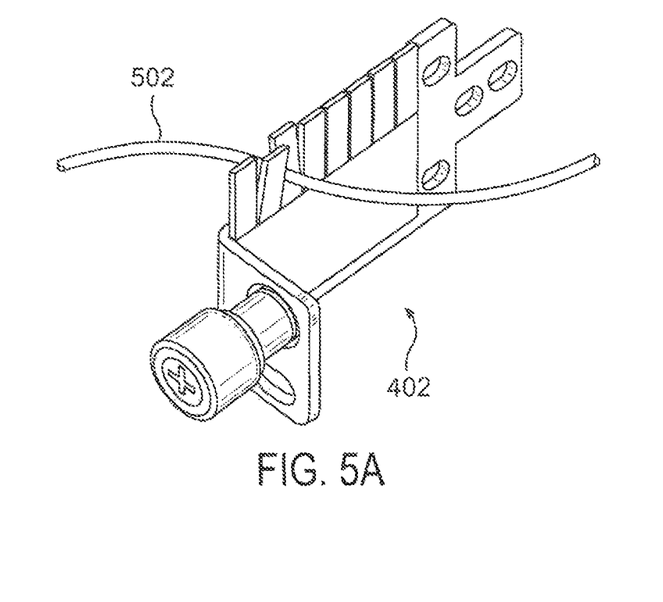
FIGS. 5A and 5B are front and rear perspective views of the embodiment of FIGS. 4A and 4B with a cord passing through the curtain.
Figure 5B:
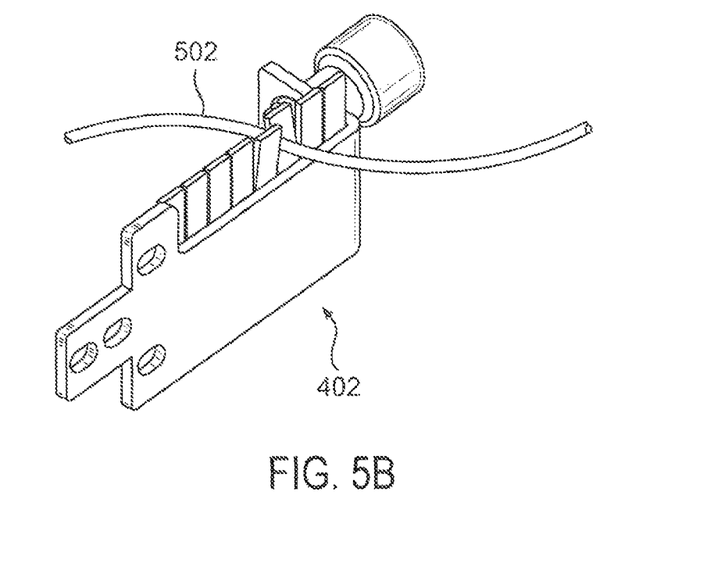

Referring now to FIGS. 5A and 5B, mounting ear 402 is shown with a cord 502 (which may by way of non-limiting example be a data and/or power cord). The power cord 502 passes through the gap 414, parting the proximate bristles 418. The cord 502 and the unaffected portions of bristles 518 collectively substantially plug gap 414 to prevent air and contaminants from passing through.

Figure 6A:
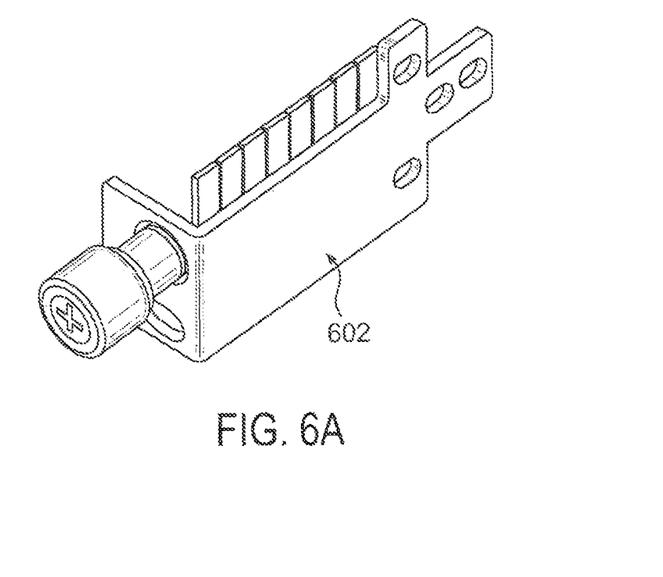
FIGS. 6A and 6B are front and rear perspective views of an embodiment of a mounting ear according to another embodiment of the invention.
Figure 6B:
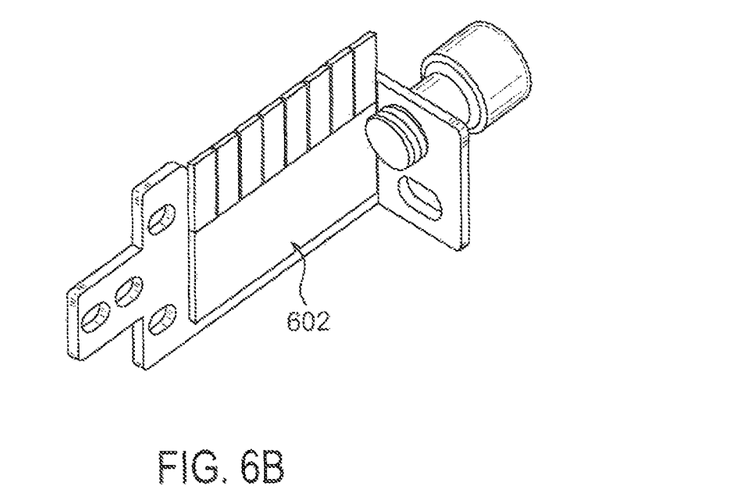

Mounting ear 402 is "right hand" orientated, as it can be connected to the right side of the rack with the bristles 418 facing up; it could also be used on the left side of the rack with bristles 418 pointing down. In addition and/or the alternative, a "left hand" orientation could be used, such as mounting ear 602 in FIGS. 6A and 6B.

Figure 7:
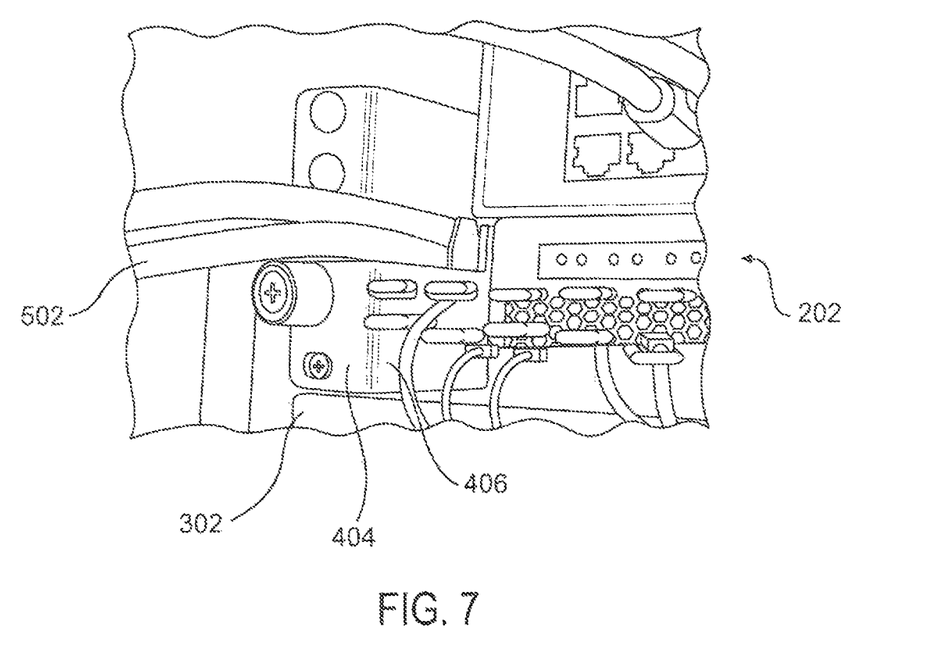
FIG. 7 illustrates the mounting ear of FIG. 6A in a deployed state.

FIG. 7 shows mounting ear 602 installed on a rack. Mounting ear is shown with its front plate 404 connected to left rail 302 and side plate 406 connected to component 202. A cord 502 passes through the bristles 418 into the rack. Mounting ear 402, or an inverted mounting ear 602, could be similarly used on an the opposite side right rail to similarly support the other side of a component 202. However, the invention is not limited to pairs of mounting ears, and mounting ear 402/602 may be used for connection one or more of the corners of component 202.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A mounting ear, comprising:
   a front plate;
   a side plate connected to the front plate, comprising:
      a tail section proximate to the rear of the side plate;
      a midsection between the front plate and the tail section;
      a side of the tail section and top of the midsection defining a gap above the midsection;
   a brush mounted on at least the midsection;
   the brush including plurality of bristles extending from the brush such that the end of the bristles are substantially collinear with a top of the at least of portion of the tail section, to thereby substantially cover the gap;
   wherein the front plate is configured to attach to a vertical rail of a rack, the side plate is configured to attach to a horizontal component to support the component perpendicular to the rail in the rack, the gap is configured to accommodate a cord for the component or other accessories in the rack, and the bristles form a curtain across the gap to limit the flow of air and contaminants through the gap while providing a pathway for the cord to pass through the gap.

2. The mounting ear of claim 1, wherein the brush comprises a strip of rubber, and the bristles are cut flaps of the strip of rubber.

3. The mounting ear of claim 1, wherein the brush is glued to the midsection.

4. The mounting ear of claim 1, wherein the brush extends substantially across all of the midsection.

5. The mounting ear of claim 1, wherein the front plate has substantially the same height as the midsection.

6. The mounting ear of claim 1, wherein the tail section has a height substantially equal to the height of the component.

7. The mounting ear of claim 1, further comprising an end of the side panel rear of the tail section having a smaller height than the tail section.

8. A rack system, comprising:
 a rack chamber having vertical rails;
 a component mounted horizontally in the rack chamber;
 a cord connected to a jack inside the rack chamber;
 a mounting ear connecting the component to the rack chamber, comprising:
  a front plate;
  a side plate connected to the front plate, comprising:
   a tail section proximate to the rear of the side plate;
   a midsection between the front plate and the tail section;
   a side of the tail section and top of the midsection defining a gap above the midsection;
  a brush mounted on at least the midsection;
  the brush including plurality of bristles extending from the brush such that the end of the bristles are substantially collinear with a top of the at least of portion of the tail section, to thereby substantially cover the gap;
 wherein the front plate is attached to one of vertical rails, the side plate is attached to the component, the cord parts the bristles and passes through the gap, and the bristles form a curtain across the gap to limit the flow of air and contaminants into the rack chamber.

9. The rack system of claim 8, wherein the brush comprises a strip of rubber, and the bristles are cut flaps of the strip of rubber.

10. The rack system of claim 8, wherein the brush is glued to the midsection.

11. The rack system of claim 8, wherein the brush extends substantially across all of the midsection.

12. The rack system of claim 8, wherein the front plate has substantially the same height as the midsection.

13. The rack system of claim 8, wherein the tail section has a height substantially equal to the height of the component.

14. The rack system of claim 8, further comprising an end of the side panel rear of the tail section having a smaller height than the tail section.

\* \* \* \* \*